United States Patent
Tsai et al.

(10) Patent No.: US 9,508,556 B1
(45) Date of Patent: Nov. 29, 2016

(54) METHOD FOR FABRICATING FIN FIELD EFFECT TRANSISTOR AND SEMICONDUCTOR DEVICE

(71) Applicant: Taiwan Semiconductor Manufacturing Co., Ltd., Hsinchu (TW)

(72) Inventors: Chun Hsiung Tsai, Hsinchu County (TW); Chien-Tai Chan, Hsinchu (TW); Ziwei Fang, Hsinchu (TW); Kei-Wei Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/009,828

(22) Filed: Jan. 29, 2016

(51) Int. Cl.
H01L 29/66 (2006.01)
H01L 21/30 (2006.01)
H01L 21/8238 (2006.01)
H01L 21/02 (2006.01)
H01L 29/78 (2006.01)

(52) U.S. Cl.
CPC ..... *H01L 21/3003* (2013.01); *H01L 21/02529* (2013.01); *H01L 21/02532* (2013.01); *H01L 21/02661* (2013.01); *H01L 21/823814* (2013.01); *H01L 21/823821* (2013.01); *H01L 21/823864* (2013.01); *H01L 29/66636* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 8,487,399 B2 * | 7/2013 | Cho | H01L 29/66795 257/506 |
| 2015/0064889 A1 * | 3/2015 | Paraschiv | H01L 21/82343 438/514 |
| 2016/0111518 A1 * | 4/2016 | Chang | H01L 29/6681 257/401 |
| 2016/0111536 A1 * | 4/2016 | Chen | H01L 29/7848 257/401 |
| 2016/0204131 A1 * | 7/2016 | Cheng | H01L 27/1211 257/351 |

* cited by examiner

*Primary Examiner* — Alexander Ghyka
(74) *Attorney, Agent, or Firm* — Jianq Chyun IP Office

(57) ABSTRACT

A method for fabricating a fin field effect transistor (FinFET) is provided. The method includes steps as follows. A gate stack is formed over a substrate having a semiconductor fin. Recesses are formed in the semiconductor fin beside the gate stack. A pre-clean process is performed to remove native oxides on surfaces of the recesses. After the pre-clean process, a selectivity proximity push process is performed using a fluorine-containing gas and a first hydrogen gas to the recesses. Strained layers are formed in the recesses.

20 Claims, 8 Drawing Sheets

US 9,508,556 B1

METHOD FOR FABRICATING FIN FIELD EFFECT TRANSISTOR AND SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
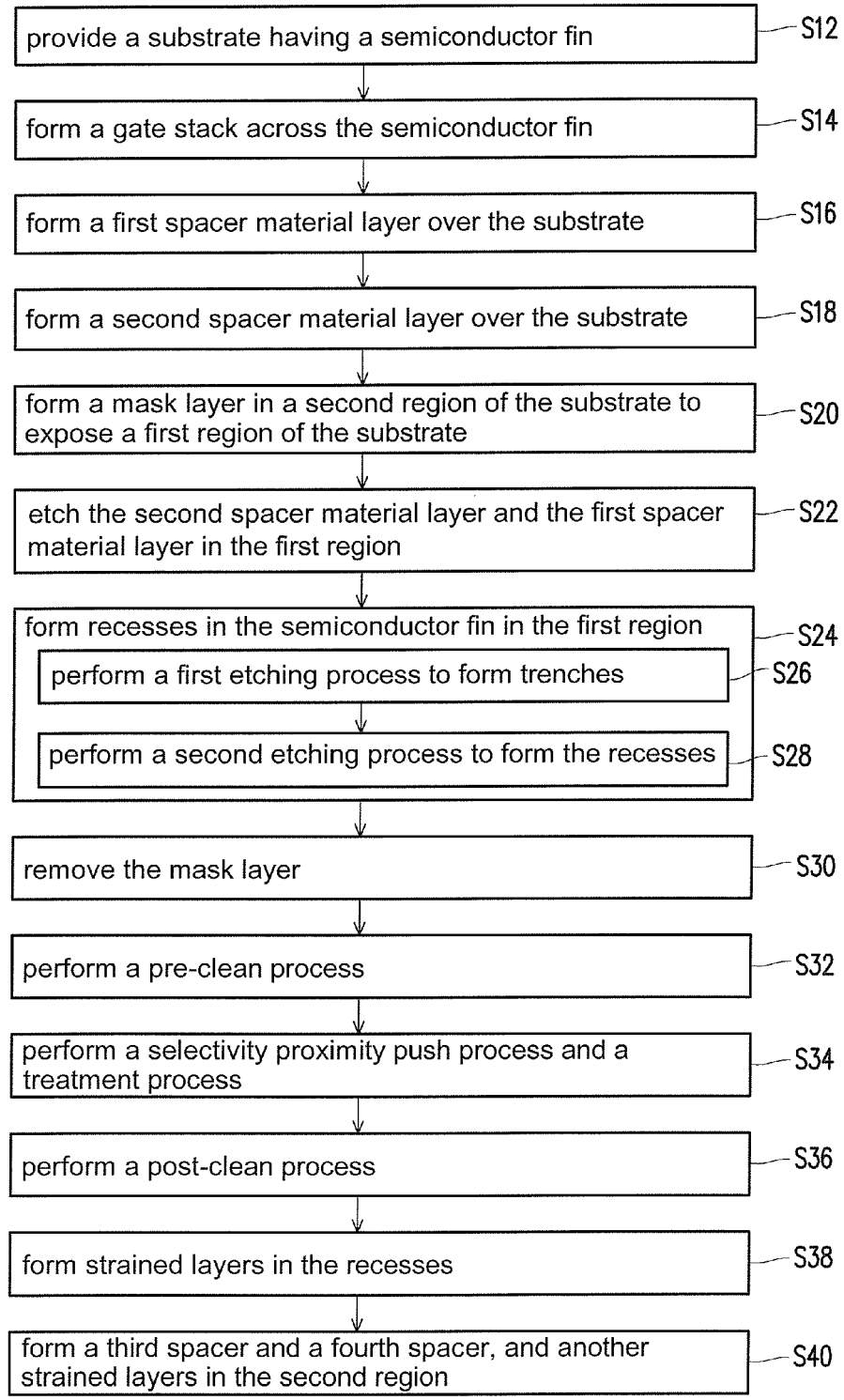
FIG. 1 is a flow chart illustrating a method for fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method for fabricating a semiconductor device in accordance with some embodiments. FIGS. 2A to 2G are perspective views of a method for fabricating a semiconductor device in accordance with some embodiments.

Figure 2A:
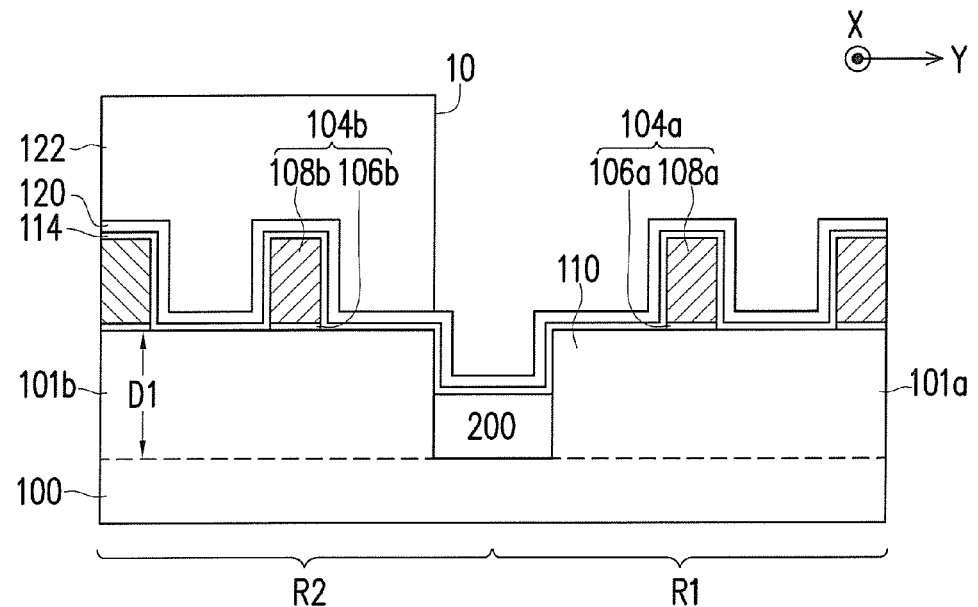
FIGS. 2A to 2G are cross-sectional views a method for fabricating a semiconductor device in accordance with some embodiments.

At Step 12 in FIG. 1 and as shown in FIG. 2A, a substrate 100 is provided. The substrate 100 is divided into a first region R1 and a second region R2. The substrate 100 includes a bulk substrate, a silicon-on-insulator (SOI) substrate or a germanium-on-insulator (GOI) substrate, for example. In one embodiment, the substrate 100 includes a crystalline silicon substrate (e.g., wafer). The substrate 100 may include various doped regions depending on design requirements (e.g., p-type substrate or n-type substrate). In some embodiments, the doped regions may be doped with p-type or n-type dopants. For example, the doped regions may be doped with p-type dopants, such as boron or $BF_2^+$, n-type dopants, such as phosphorus or arsenic, and/or a combination thereof. The doped regions may be configured for a p-type FinFET formed in the first region R1, or alternatively configured for an n-type FinFET formed in the second region R2. In some alternative embodiments, the substrate 100 may be made of some other suitable elemental semiconductors, such as diamond or germanium, a suitable compound semiconductor, such as gallium arsenide, silicon carbide, indium arsenide, or indium phosphide, or a suitable alloy semiconductor, such as silicon germanium carbide, gallium arsenic phosphide, or gallium indium phosphide. Also, in some embodiments, the substrate may include other conductive layers or other semiconductor elements, such as transistors, diodes or the like.

As shown in FIG. 2A, the substrate 100 has semiconductor fins 101a and 101b and isolation structures 200. The semiconductor fins 101a and 101b are formed of a material the same as or different from a material of the substrate 100. In some embodiments, a depth D1 of the semiconductor fins 101a and 101b ranges from 40 nm to 55 nm. The isolation structures 200 include silicon oxide, silicon nitride, silicon oxynitride, a spin-on dielectric material, a low-k dielectric material, or a combination thereof and formed by performing a high-density-plasma chemical vapor deposition (HDP-CVD) process, a sub-atmospheric CVD (SACVD) process or a spin-on process, for example.

As shown in FIG. 2A, in some embodiments, the semiconductor fins 101a and 101b are formed by forming trenches, or forming shallow trench isolation (STI) regions in the trenches, and lowering a top surface of the STI regions by performing an etching process to a level lower than an original top surface of the substrate 100. The remaining portions of the STI regions become the isolation structures 200, and the remaining portions of the substrate 100 between the isolation structures 200 thus become the semiconductor fins 101a and 101b. Top surfaces of the isolation structures 200 are lower than top surfaces of the semiconductor fins 101a and 101b. In other words, top portions 110 of the semiconductor fins 101a and 101b protrude from the top surfaces 200a of the isolation structures 200.

In some other embodiments, the semiconductor fins 101a and 101b are formed of a material different from that of the substrate 100. The semiconductor fins 101a and 101b may be formed by lowering top portions of the substrate 100 between the adjacent isolation structures 200 to form the recesses, and re-growing a semiconductor material different from that of substrate 100 in the recesses. Top portions of the STI regions may then be removed by performing a chemical mechanical polish process and an etching process, while bottom portions of the STI regions are not removed. As a result, the remaining portions of STI regions become the isolation structures 200, and the top portions of the re-grown semiconductor material between the adjacent isolation structures 200 become the semiconductor fins 101a and 101b.

At Step S14 in FIG. 1 and as shown in FIG. 2A, gate stacks 104a and 104b are formed across the semiconductor fins 101a and 101b respectively. In one embodiment, an extending direction X of the gate stacks 104a and 104b is, for example, perpendicular to an extension direction Y of the semiconductor fins 101a and 101b, so as to cover middle portions of the semiconductor fins 101a and 101b. In some embodiments, the gate stack 104a includes a gate dielectric layer 106a and a gate electrode 108a. Similarly, the gate stack 104b includes a gate dielectric layer 106b and a gate electrode 108b. In alternative embodiments, the gate structure 104a or 104b may further include an interfacial layer (IL) on the semiconductor fin 101a or 101b. In other words, the gate dielectric layer 106a or 106b is formed between the IL and the gate electrode 108a or 108b. In some embodiments, the IL includes a dielectric material, such as silicon oxide or silicon oxynitride. The IL is formed by performing a thermal oxidation process, a chemical vapor deposition (CVD) process, or an atomic layer deposition (ALD) process.

The gate dielectric layer 106a and 106b are formed to cover portions of the semiconductor fins 101a and 101b respectively. In some embodiments, the gate dielectric layer 106a and 106b include silicon oxide, silicon nitride, silicon oxynitride, high-k dielectric materials, or a combination thereof. The high-k dielectric materials are generally dielectric materials with a dielectric constant higher than 4. The high-k dielectric materials include metal oxide. In some embodiments, examples of the metal oxide used as the high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or a combination thereof. The gate dielectric layer 106a and 106b are formed by performing a thermal oxidation process, a CVD process, an ALD process, or a combination thereof.

The gate electrodes 108a and 108b are formed on the gate dielectric layers 106a and 106b respectively. In some embodiments, the gate electrodes 108a and 108b are polysilicon gate structures or replacement metal gate structures. A material of the gate electrodes 108a and 108b include doped or undoped polysilicon or a metal-containing conductive material. The metal-containing conductive material includes a barrier, a work function layer, a seed layer, an adhesion layer, a barrier layer, or a combination thereof. The metal-containing conductive material includes Al, Cu, W, Ti, Ta, Ag, Ru, Mn, Zr, TiAl, TiN, TaN, WN, TiAlN, TaN, TaC, TaCN, TaSiN, NiSi, CoSi, or a combination thereof, for example. In some embodiments, the gate electrodes 108a and 108b include metal-containing conductive materials suitable for a PMOS device, such as TiN, WN, TaN, or Ru.

In some alternative embodiments, the gate electrodes 108a and 108b include metal-containing conductive materials suitable for an NMOS device, such as Ti, Ag, Al, TiAl, TiAlN, TaC, TaCN, TaSiN, Mn, or Zr. The gate electrodes 108a and 108b may be formed by performing a suitable process such as an ALD process, a CVD process, a PVD process, a plating process, or a combination thereof.

At Step S16 in FIG. 1 and as shown in FIG. 2A, a first spacer material layer 114 is formed over the substrate 100. The first spacer material layer 114 is formed of dielectric materials, such as silicon oxide, silicon nitride, SiCN, high-k dielectric materials (such as SiCON), or a combination thereof. The first spacer material layer 114 may be formed by performing a suitable process such as an ALD process, a CVD process, or a combination thereof. A thickness of the first spacer material layer 114 ranges from about 1 nm to about 5 nm.

In some embodiment, after the first spacer material layer 114 is formed, the substrate 100 undergoes an additional substrate treatment to form FET devices. A process to form the FET devices includes doping the semiconductor fins 101a and 101b to form lightly doped source and drain (LDD) regions (not shown). The LDD regions are formed by performing an ion implantation. In some embodiments, the semiconductor fins 101a in the first region R1 is doped with p-type dopants and the semiconductor fins 101b in the second region R2 is doped with n-type dopants.

Figure 2B:
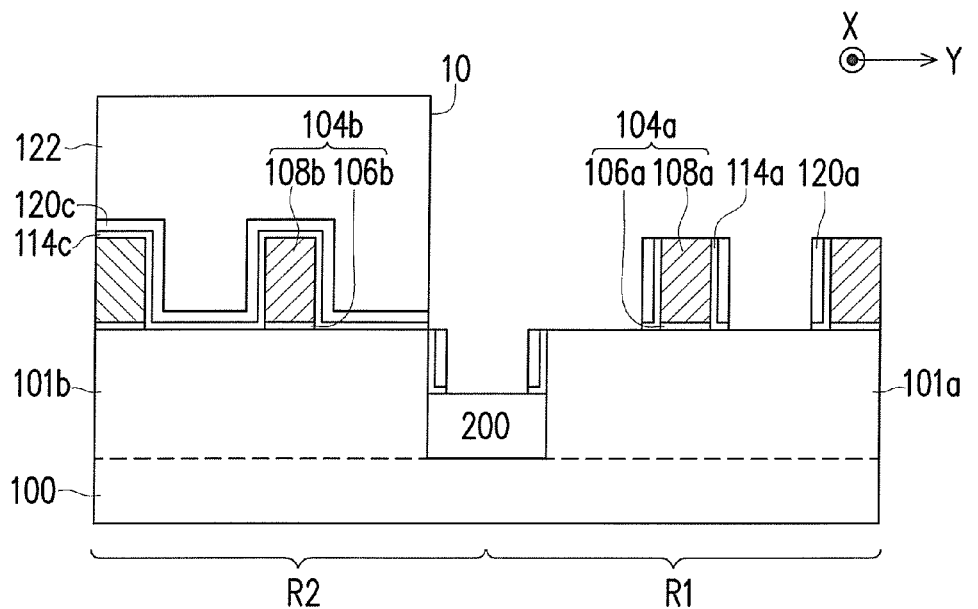

At Step S18 in FIG. 1 and as shown in FIG. 2B, a second spacer material layer 120 is formed over the substrate 100. A material of the second spacer material layer 120 is different from that of the first spacer material layer 114. The second spacer material layer 120 is formed of dielectric materials, such as silicon oxide, silicon nitride, SiCN, high-k dielectric materials (such as SiCON), or a combination thereof. The second spacer material layer 120 may be a single-layer or a multi-layer structure. In an embodiment, the second spacer material layer 120 includes an offset spacer material and a dummy spacer material layer. The second spacer material layer 120 may be formed by performing a suitable process such as an ALD process, a CVD process, or a combination thereof. A thickness of the second spacer material layer 120 ranges from 1 nm to 5 nm.

At Step S20 in FIG. 1 and as shown in FIG. 2A, a mask layer 122 is formed over the substrate 100. In some embodiments, the mask layer 122 is formed over the second region R2, and the second region R2 is an N-type FinFET region, for example. Specifically, the mask layer 122 overlays the second spacer material layer 114. On the other hand, the mask layer 122 has an opening 10 which exposes the second spacer material layer 114 in the first region R1, and the first region R1 is a P-type FinFET region. The mask layer 122 is formed by performing processes such as spin-coating a mask material layer, performing a photolithography processes to the mask material layer, etching off part of the mask material layer, and/or other processes. Specifically, the photolithography processes include exposure, bake, and development. The mask layer 122 is sensitive to a specific exposure beam such as KrF, ArF, EUV or e-beam light. For example, the mask material layer may be a photoresist made of a photosensitive resin or other suitable materials. In some embodiments, the mask material layer includes organic compound, polymer, quencher, chromophore, solvent and/or chemical amplifier (CA). In other words, in some embodiments, at least one of the first spacer material layer 114, the second spacer material layer 120 and the mask layer 122 includes a carbon containing material.

At Step S22 in FIG. 1 and as shown in FIG. 2A and FIG. 2B, the second spacer material layer 120 and the first spacer material layer 114 are etched by performing an anisotropic process (such as a plasma process), so that second spacers 120a and first spacers 114a are formed at sidewalls of the gate stack 104a, and a second spacer layer 120c and a first spacer layer 114c are remained in the second region R2.

Figure 2C:
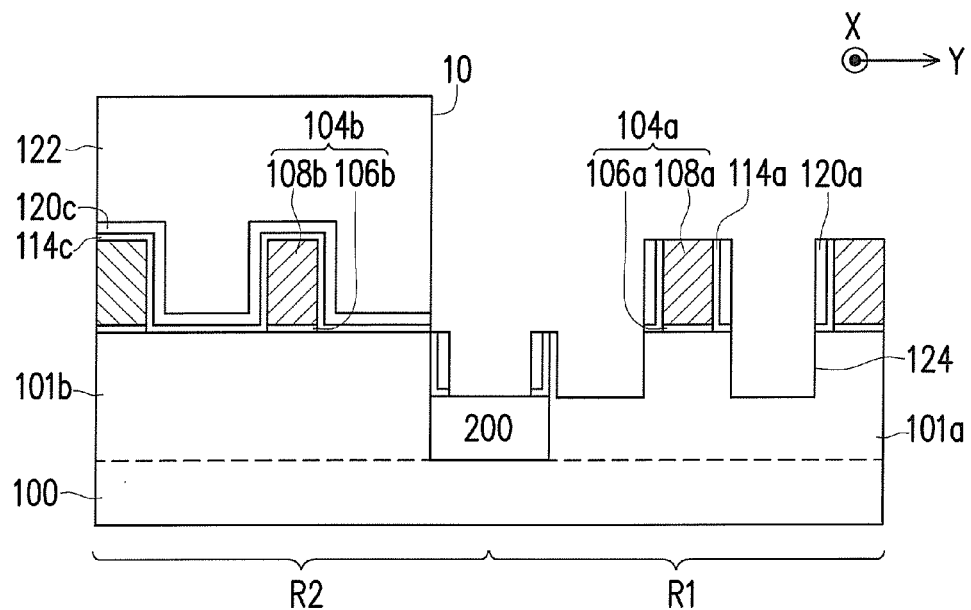
Figure 2D:
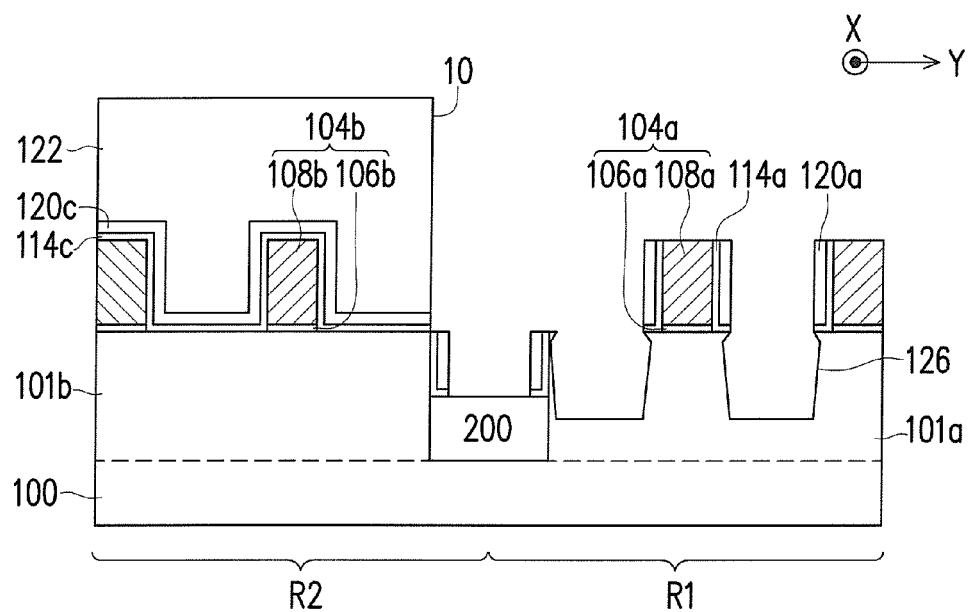

At Step S24 in FIG. 1 and as shown in FIG. 2D, recesses 126 are formed within the semiconductor fin 101a beside the gate stacks 104a by removing a portion of the semiconductor fins 101 at locations intended for source and drain regions. The recesses 126 are formed by performing one or more etching processes.

At Steps S26 and S28 in FIG. 1, and as shown in FIG. 2D, in some embodiments, the formation of the recesses 126 includes performing a first etching process and a second etching process. In other words, the first etching process is referred to as a trench etching process, and the second etching process is referred to as a lateral etching process.

At Steps S26 in FIG. 1, and as shown in FIG. 2C, the semiconductor fin 101a is etched by performing the first etching process, and trenches 124 are formed in the semiconductor fin 101a. A depth of the trenches 124 is greater than 60 nanometers and may range from 70 nanometers to 80 nanometers, for example. At Steps S28 in FIG. 1, and as shown in FIG. 2D, the second etching process is performed to further remove the semiconductor fins 101a around the trenches 124, so that the recesses 126 are formed in the semiconductor fins 101a. The recesses 126 are deeper and wider than the trenches 124. In some embodiments, a ratio of the depth of the trenches 124 to the depth of the recesses 126 is in a range form 60% to 90%. In some embodiments, the first etching process includes one or more anisotropic etching processes, and the second etching process includes one or more isotropic etching processes. In some embodiments, the recesses 126 are etched by performing the first etching process (i.e. the trench etching process) to form U-shaped etch profiles or V-shaped etch profiles, followed by the second etching process (i.e. the lateral etching process) to form diamond-shaped recess profiles. The first etching process or the second etching process includes one or more reactive ion etching (RIE) processes. Such processes optionally include bombarding the substrate 100 with ions (e.g., fluorocarbons, oxygen, chlorine, nitrogen, argon, helium, etc.) to dope or amorphize portions of the substrate 100.

At Step S30 in FIG. 1 and as shown in FIG. 2D, after the recesses 126 are formed, the mask layer 122 is removed through a dry stripping process, a wet stripping process, or other suitable processes.

At Step S32 in FIG. 1, a pre-clean process is performed to remove native oxides formed on surfaces of the recesses 126 (shown in FIG. 2D). The pre-clean process may include a dry etching process such as SiCoNi™ etch process.

Figure 2E:
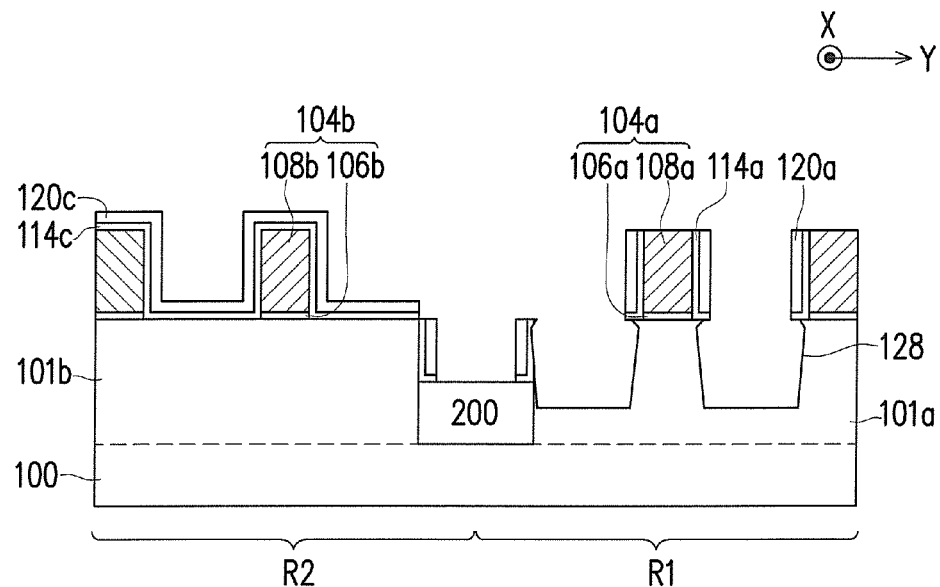

At Step S34 in FIG. 1 and as shown in FIG. 2D and FIG. 2E, a selectivity proximity push process and a treatment process are performed. The selectivity proximity push process and the treatment process are performed after the etching processed for the recesses 126 and after the mask layer 122 is removed. Thus, the selectivity proximity push process and the treatment process are also referred to as an ex-situ selectivity proximity push process and an ex-situ treatment process, respectively. The selectivity proximity push process is performed to widen the recesses 126, so that recesses 128 are formed. In some embodiment, the recesses 128 are wider than the recesses 126. In alternative embodiments, the recesses 128 are wider and deeper than the recesses 126. The treatment process is performed to remove residues on the surface of the recesses 126. In some embodiments, the residues include carbon residues. The carbon residues may be residues generated during etching or cleaning the second spacer material layer 114, the second spacer material layer 120 or the mask layer 122 (shown in FIG. 2A).

In some embodiments, the selectivity proximity push process is performed before the treatment process. In alternative embodiments, the selectivity proximity push process and the treatment process are performed at the same time. In some embodiment, the selectivity proximity push process and the treatment process are performed by a remote plasma. A fluorine-containing gas and hydrogen gas are used to serve as a plasma source, a co-flow gas, or a combination thereof. The co-flow gas may include a carrier gas.

Figure 3:
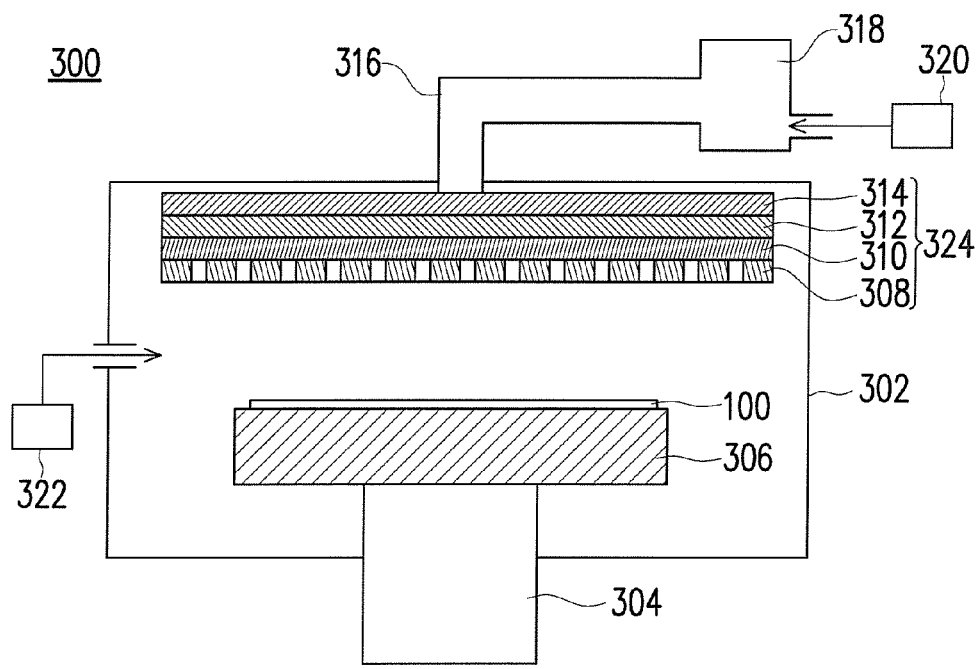
FIG. 3 is a view illustrating a remote plasma apparatus in accordance with some embodiments.

FIG. 3 is a view illustrating a remote plasma apparatus in accordance with some embodiments.

As shown in FIG. 3, a remote plasma apparatus 300 includes a chamber 302, a stage supporter 304, a pedestal 306, a gas distribution apparatus 324, a plasma supply line 316, a plasma generation region 318, a plasma source (or referred as a plasma feed gas) 320 and a co-flow gas (or referred as a non-plasma gas) 322.

The pedestal 306 is disposed within the chamber 302 and over the stage supporter 304. The co-flow gas 322 enters through the sidewall of the chamber 302 to be directly introduced to the substrate 100 over the pedestal 306.

The gas distribution apparatus 324 is disposed over the pedestal 306 within the chamber 302. In some embodiments, the gas distribution apparatus 324 includes a gas box 314, a faceplate 312, a selectivity modulation device 310 and a showerhead 308. In alternative embodiments, the selectivity modulation device 310 may not be included in the gas distribution apparatus 324.

The faceplate 312 is disposed between the gas box 314 and the selectivity modulation device 310. The selectivity modulation device 310 is disposed between the faceplate 312 and the showerhead 308.

The selectivity modulation device 310 removes the ions and electrons generated in the plasma in order to maximize the formation of radicals. The selectivity modulation device 310 functions as a filter by controlling the amount of radicals that pass through. The selectivity modulation device 310 can also trap electrons, ions and ultraviolet radiation and is capable of preventing plasma from reaching the wafer.

The showerhead 308 includes a plurality of openings. The openings are uniformly distributed on the showerhead 308 in concentric rings spaced apart from a center pint in various distances. The dimensions and number of the openings determine the amount of gas within the chamber 302. If a high gas amount at the edge of the showerhead 308 is desired, more or larger openings are configured at the edge of the showerhead 308. In contrast, if a high gas amount at the center of the showerhead 308 is desired, more or larger openings are configured at the center of the showerhead 380.

The plasma supply line 316 connects the gas box 314 and the plasma generation region 318. The plasma source 320 enters plasma generation region 318. Within the plasma generation region 318, the plasma source 320 has its internal energy activated. For example, one or more components of the plasma source 320 may be ionized; one or more components of the plasma source may be dissociated into more reactive species. The active species formed in the plasma generation region 318 are transferred to the gas distribution apparatus 324 through the plasma supply line 316, and further react with the co-flow gas (the non-plasma gas) 322 subsequently.

FIG. 4A to FIG. 4E are views illustrating embodiments of performing a selectivity proximity push process and a treatment process. For ease of illustration, the fluorine-containing gas (e.g., $NF_3$, referred to in FIGS. 4A to 4E as G1), the first hydrogen gas (referred to in FIGS. 4A to 4E as G2), the second hydrogen gas (referred to in FIGS. 4A to 4E as G3), and a showerhead 308 are shown in FIGS. 4A to 4E.

Figure 4A:
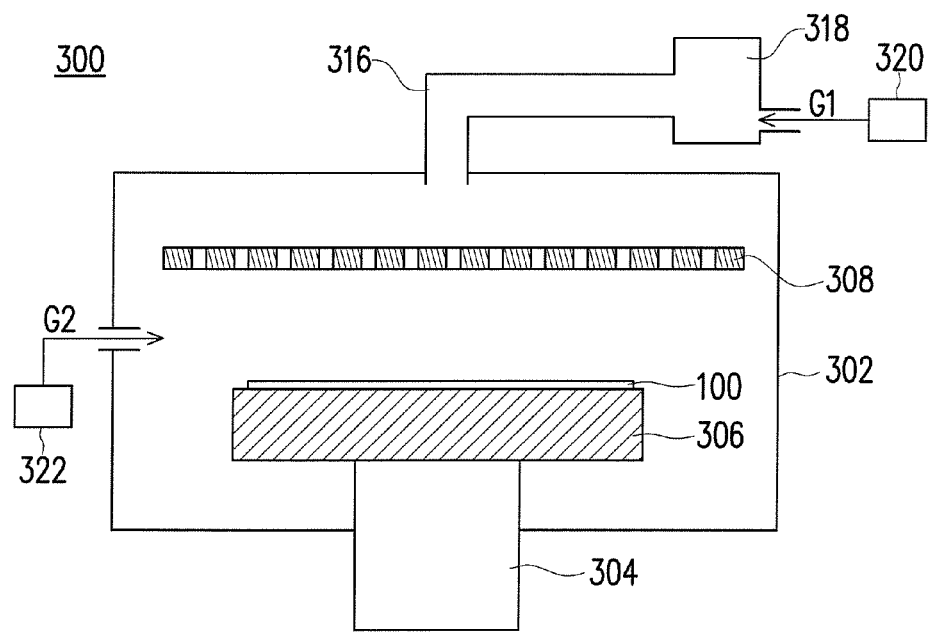
FIG. 4A to FIG. 4E are views illustrating embodiments of performing a selectivity proximity push process and a treatment process.
Figure 4B:
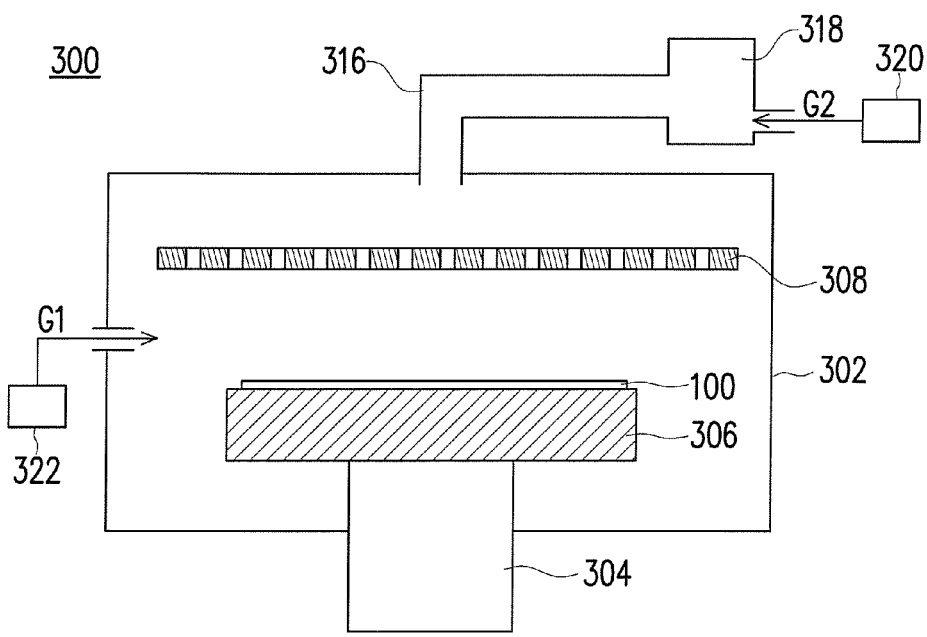
Figure 4C:
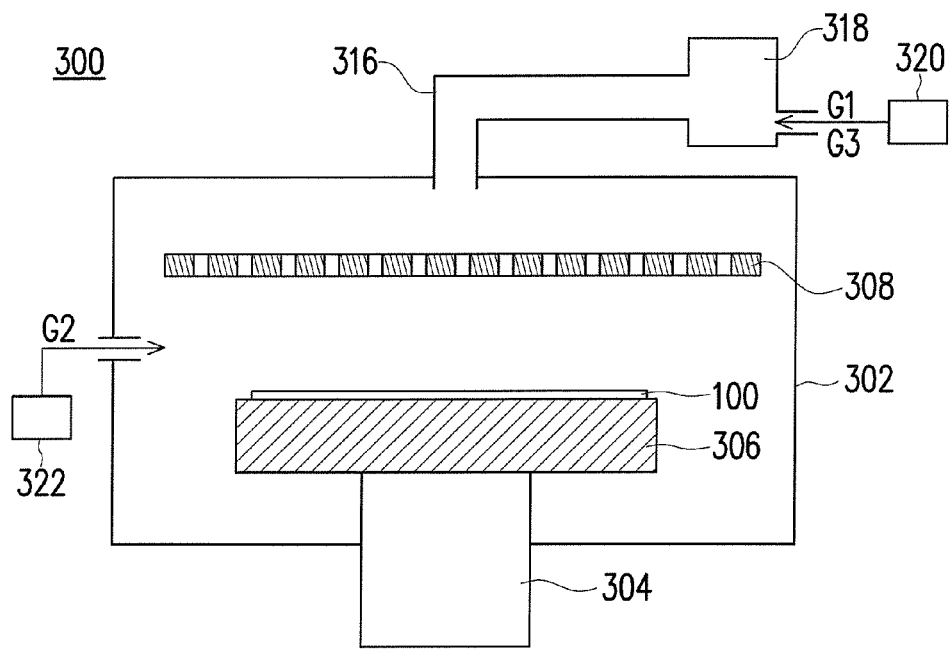
Figure 4D:
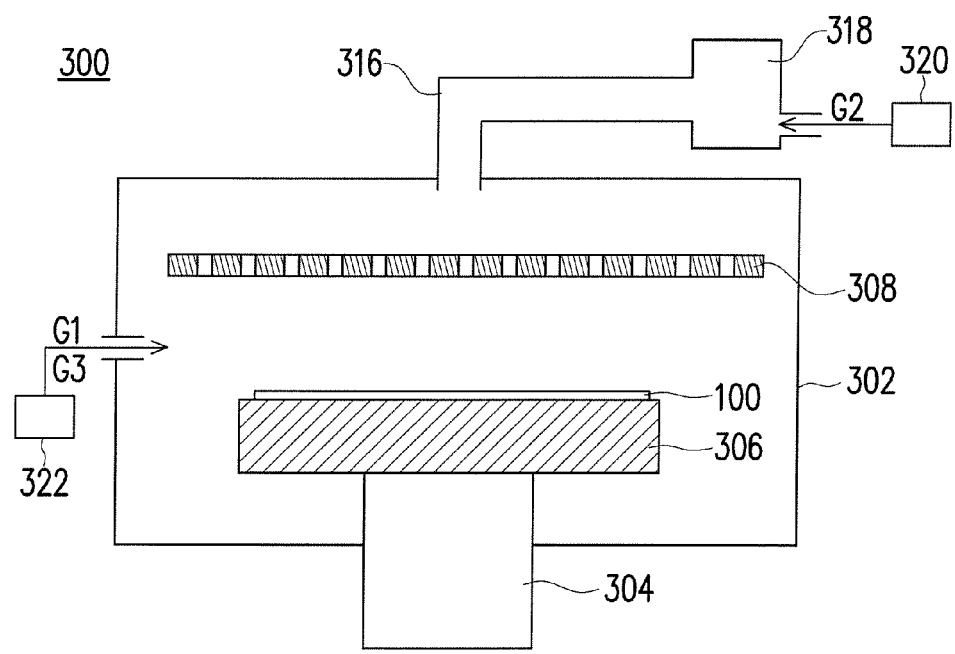
Figure 4E:
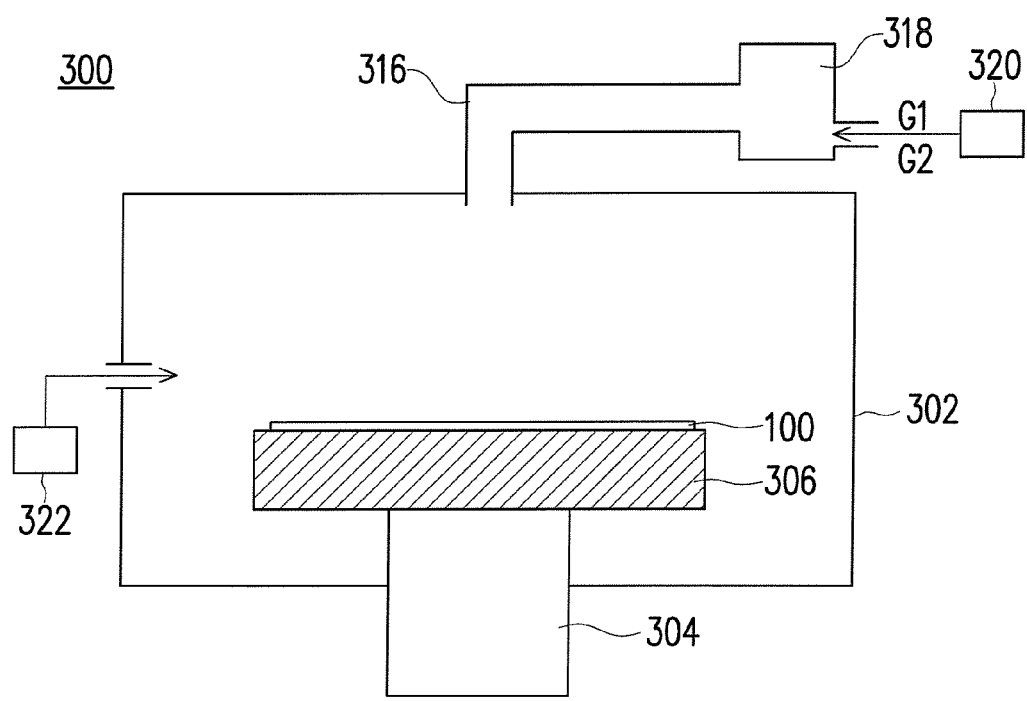

In some embodiment, the selectivity proximity push process and the treatment process are performed at the same time by a remote plasma using a fluorine-containing gas G1 and a first hydrogen gas G2, as shown in FIG. 4A, FIG. 4B and FIG. 4E. In alternative embodiments, the selectivity proximity push process and the treatment process are performed at the same time by performing a remote plasma process using a fluorine-containing gas G1, a first hydrogen gas G2 and a second hydrogen gas G3, as shown in FIG. 4C and FIG. 4D. In some embodiments, the fluorine-containing gas G1 includes $NF_3$. In addition, in some embodiments, the fluorine-containing gas G1, the first hydrogen gas G2, the second hydrogen gas G3, or a combination thereof is introduced to the substrate 100 through the showerhead 308, as shown in FIG. 4A to FIG. 4D. In addition, in alternative embodiments, the fluorine-containing gas G1 and the first hydrogen gas G2 are directly introduced to the substrate 100 without passing through a showerhead, as shown in FIG. 4E.

As shown in FIG. 4A and FIG. 4B, one of the fluorine-containing gas G1 and the first hydrogen gas G2 serves as a plasma source introduced to the substrate 100 through the showerhead 308, and the other one of the fluorine-containing gas G1 and the first hydrogen gas G2 serves as a co-flow gas directly introduced to the substrate 100.

In some embodiments, as shown in FIG. 4A, the fluorine-containing gas G1 serves as a plasma source introduced to the substrate 10 through the showerhead 308, and the first hydrogen gas G2 serves as a co-flow gas directly introduced to the substrate 100. In some embodiments, the fluorine-containing gas G1 includes $NF_3$. $NF_3$ is dissociated by plasma to generate plasma radicals such as $N^*$, $N_2^*$, $F^*$, $F_2^*$, $NF_x^*$, etc. F radical ($F^*$) is captured by the first hydrogen gas G2 to form $H_yF_z$ complex radicals ($H_yF_z^*$). $H_yF_z$ complex radicals ($H_yF_z^*$) transport, diffuse and adsorb on and reacts with the Si (i.e. the surface of the recesses 126) to form $SiF_4$ and $H_2$. $H_yF_z$ complex radicals have a high etching selectivity ratio of silicon to silicon oxide (i.e. the isolation structures 200), silicon nitride, SiCN, or SiCON (i.e. the first spacer 114a or the second spacer 120a). A detailed chemical reaction is shown in Formula 1 below. Here, "x" and "y" in Formula 1 may be any possible value.

$NF_3 \rightarrow N^* + F^*$ $F^* + H_2 \rightarrow H_yF_z^*$ $H_yF_z^* + Si \rightarrow SiF_4 + H_2$   Formula 1

As shown in FIG. 4B, in alternative embodiments, the first hydrogen gas G2 serves as a plasma source introduced to the substrate 100 through the showerhead 308, and the fluorine-containing gas G1 serves as a co-flow gas directly introduced to the substrate 100. The first hydrogen gas G2 is dissociated by plasma to generate plasma radicals such as $H^*$, $H_2^*$, $H^{+*}$, and $H^{-*}$, etc. During diffusion of $NF_3$, a limited amount of $NF_3$ is dissociated by plasma to generate plasma radicals such as $N^*$, $N_2^*$, $F^*$, $F_2^*$, and $NF_x^*$, etc. $F^*$ is captured by $H^*$ to form $H_xF_y^*$, and $H_xF_y^*$ reacts with silicon in the surface of the recesses 126 to form $SiF_4$ and $H_2$. Similarly, $H_xF_y^*$ has a high etching selectivity ratio of silicon to silicon oxide, silicon nitride, SiCN, or SiCON. A detailed chemical reaction is shown in Formula 2 below. Here, "x" and "y" in Formula 2 may be any possible value.

$NF_3 \rightarrow N^* + F^*$ $F^* + H^* \rightarrow H_xF_y^*$ $H_xF_y^* + Si \rightarrow SiF_4 + H_2$   Formula 2

As shown in FIG. 4C and FIG. 4D, the selectivity proximity push process and the treatment process are performed by further using the second hydrogen gas G3 together with the fluorine-containing gas G1 to serve as the plasma sources or the co-flow gas.

As shown in FIG. 4C, in some embodiments, the fluorine-containing gas (such as $NF_3$) G1 and the second hydrogen gas G3 serve as the plasma source introduced to the substrate 100 through the showerhead 308, and the first hydrogen gas G2 serves as the co-flow gas directly introduced to the substrate 100. After $NF_3$ is dissociated, plasma radicals such as $N^*$, $N_2^*$, $F^*$, $F_2^*$, $NF_x^*$, etc., are generated, and after the second hydrogen gas G3 is dissociated by plasma, plasma radicals such as $H^*$, $H_2^*$, $H^{+*}$, $H^{-*}$ are formed. $F^*$ is captured by $H^*$ to form $H_xF_y^*$. Then, $H_xF_y^*$ is reacted with silicon in the substrate 100. The chemical reaction is as shown in Formula 2. In addition, $F^*$ is captured by the first hydrogen gas G2 below the showerhead 308 to form $H_yF_z^*$. $H_yF_z^*$ may be reacted with silicon in the substrate 100 to form $SiF_4$ and $H_2$. A detailed chemical reaction is shown in Formula 1 above.

As shown in FIG. 4D, in some embodiments, the first hydrogen gas G2 serves as the plasma source introduced to the substrate 100 through the showerhead 308, and the fluorine-containing gas G1 and the second hydrogen gas G3 serve as the co-flow gas directly introduced to the substrate 100. The first hydrogen gas G2 is dissociated by plasma to generate plasma radicals such as $H^*$, $H_2^*$, $H^{+*}$, $H^{-*}$. During diffusion of $NF_3$, a limited amount of $NF_3$ is dissociated by plasma to generate plasma radicals such as $N^*$, $N_2^*$, $F^*$, $F_2^*$, and $NF_x^*$, etc. $F^*$ is captured by $H^*$ to form $H_xF_y^*$. $H_xF_y^*$ is reacted with silicon in the substrate 100 to form $SiF_4$ and $H_2$. A detailed chemical reaction is shown in Formula 2 above. Also, a limited amount of $NF_3$ is dissociated and generate $F^*$, and $F^*$ is captured by the second hydrogen gas G3 below the showerhead 308 to form $H_yF_z^*$. $H_yF_z^*$ is reacted with silicon in the substrate 100 to form $SiF_4$ and $H_2$. Since the amount of dissociated $NF_3$ is very limited, the selectivity ratio of silicon to silicon oxide or silicon nitride may be increased.

As shown in FIG. 4E, in some embodiments, the fluorine-containing gas and the first hydrogen gas serve as plasma sources introduced to the substrate 100 without passing through a showerhead.

At Step S36 in FIG. 1 and as shown in FIG. 2E, a post-clean process is performed to remove native oxides formed on surfaces of the recesses 128. The post-clean process may include a dry etching process such as SiCoNi™ etch process.

Figure 2F:
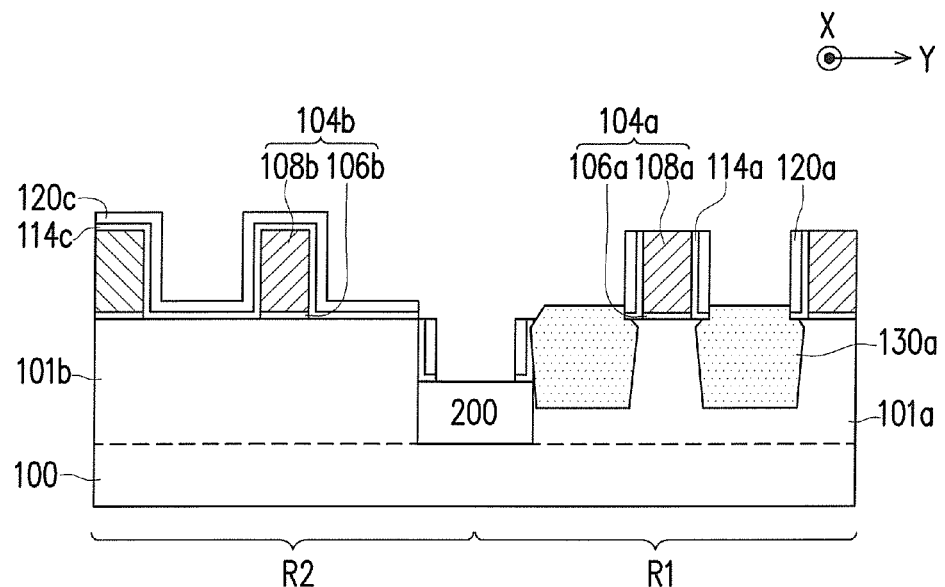

At Step S38 in FIG. 1 and as shown in FIG. 2E and FIG. 2F, strained layers 130a are formed in the recesses 128 of the semiconductor fin 101a. The strained layers 130a are formed at sides of the gate stack 104a. A lattice constant of the strained layers 130a is different from a lattice constant of the substrate 100, and portions of the semiconductor fins 101a covered by the gate stack 104a are strained or stressed to enhance carrier mobility and performance of the FinFET. In one embodiment, the strained layers 130a, such as SiGe, is utilized for electron mobility enhancement of a p-type FinFET. In some embodiments, the strained layers 130a are formed through epitaxial growth. In some embodiments, the epitaxial growth technology includes performing a low pressure CVD (LPCVD) process, an atomic layer CVD (ALCVD) process, an ultrahigh vacuum CVD (UHVCVD) process, a reduced pressure CVD (RPCVD) process, a molecular beam epitaxy (MBE) process, a metalorganic vapor phase epitaxy (MOVPE) process or a combination thereof. Alternatively, the epitaxial growth technology utilizes a cyclic deposition-etch (CDE) epitaxy process or a selective epitaxial growth (SEG) process to form the strained material of high crystal quality. In some embodiments, a material of the strained layers 130a comprises p-type dopant (such as boron or $BF_2^+$) doped therein formed by selectively growing epitaxy by performing in-situ doping.

Figure 2G:
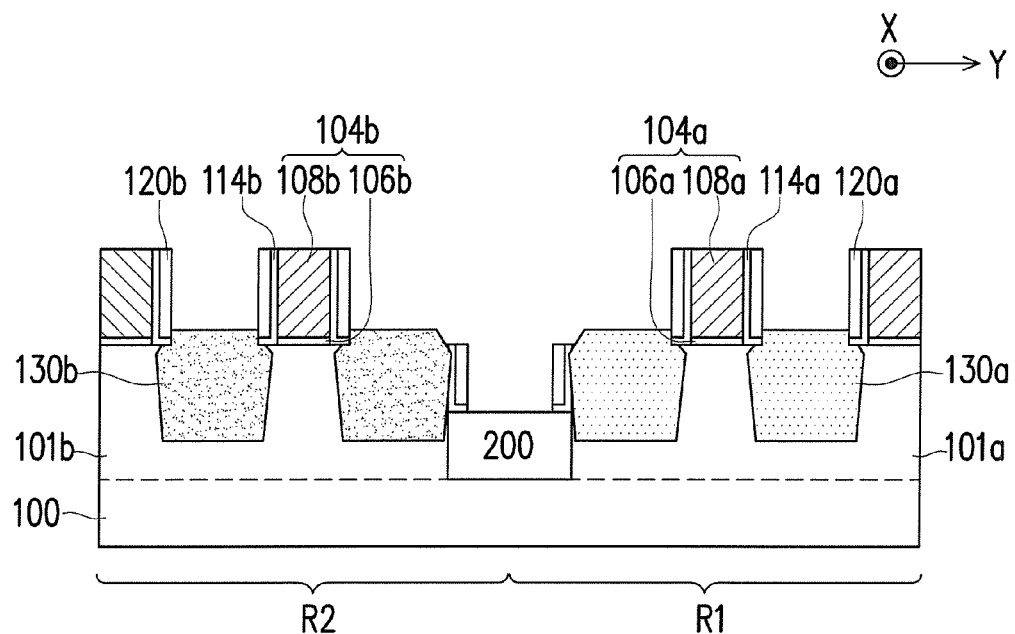

At Step S40 in FIG. 1 and as shown in FIG. 2G, following the processes above, the second spacer layer 120c and the first spacer layer 114c are etched so that a third spacer 114b and a fourth spacer 120b are formed beside the gate electrode 108b. In addition, strained layers 130b are formed in the semiconductor fin 101b in the second region R2. A lattice constant of the strained layers 130b is different from a lattice constant of the substrate 100, and portions of the semiconductor fins 101b covered by the gate stack 104b are strained or stressed to enhance carrier mobility and performance of the FinFET. In one embodiment, the strained layers 130b such as SiC or SiP, is utilized for electron mobility enhancement of an n-type FinFET. In some embodiments, a material of the strained layers 130b comprises n-type dopant (such as phosphorus or arsenic) doped therein formed by selectively growing epitaxy by performing in-situ doping.

Referring to FIG. 2E and FIGS. 4A to 4D, in some embodiments, the showerhead 308 separate the substrate 100 and the plasma, so that the plasma does not directly contact the substrate 100, and a plasma induced damage may consequently be reduced. Moreover, it is known that even though a halogen-containing (F or CO compound (such as $NF_3$) may be used to etch the substrate 100, F* generated after $NF_3$ is dissociated by plasma may react with Si in the substrate 100 and terminate Si. Thus, Si—F is formed on the surfaces of the recesses 126. A subsequent epitaxial process may thus be affected, making strained layers formed in the subsequent epitaxial process include impurities. Also, it is known that $NF_3$ is non-selective to the isolation structure 200 (e.g. silicon oxide), the first spacer 114a, and the second spacer 120a. Thus, during the etching process, the first spacer 114a and the second spacer 120a may be damaged easily. The damage may result in extrusion of a metal gate as well as loss of the isolation structure 200. Thus, the isolation between the subsequently formed strained layers 130a may be insufficient. In the embodiments, F* generated after the fluorine-containing gas G1 (such as $NF_3$) is dissociated by plasma may be isolated by the showerhead 308, and does not react with Si in the substrate 100 before arriving at the surface of the substrate 100. F* may be captured by the hydrogen gas or H radicals (H*) after dissociation of the hydrogen gas. $H_yF_z^*$ or $H_xF_y^*$ having a high selectivity ratio to the isolation structure 200 (e.g., silicon oxide), the first spacer 114a and the second spacer 120a (e.g., silicon nitride, SiCON, SiCN) are generated. Thus, in the embodiments, a critical dimension of the first spacer 114a and the second spacer 120a may be maintained when the selectivity proximity push process is performed, and an increase of (effective capacitance, Ceff) may be prevented or suppressed.

As shown in FIG. 4B and FIG. 4D, in the above embodiments, H radicals generated after the first hydrogen gas or the second hydrogen gas as the plasma source is dissociated may remove carbon residues.

As shown in FIG. 4C and FIG. 4D, after the first hydrogen or the second hydrogen as the co-flow gas is dissociated, H* may be chemisorbed and physisorbed by Si of the substrate 100 (or the recesses 126) to form Si—H, so as to protect the surface of the substrate 100 (or the recesses 126) and reduce an oxidation rate of the surface of the substrate 100. During a thermal process (at a temperature from 300° C. to 500° C.) in the subsequent epitaxial process for forming the strained layers 130a, H that is chemisorbed and physisorbed on Si may be desorbed, such that germanium in the strained layers 130a may be bonded with Si. Therefore, a critical dimension (CD) of the strained layers does not overly large and a structure of the strained layers 130a may be preferable. Moreover, unwanted Ceff may be prevented or reduced.

As shown in FIG. 2D and FIG. 2E, moreover, ion bombarding performed when the recesses 126 are formed may make the surface of the substrate 100 rough or uneven. The surface roughness may affect the quality of the epitaxial layer to be deposited upon the substrate. In the above embodiments, the roughness or unevenness of the surface of the substrate 100 caused by ion bombarding may be alleviated because of the low power of the remote plasma that is used. Thus, compared with the recesses 126, the recesses 128 have smoother surfaces. Thus, the quality of the subsequently formed strained layers may be more preferable.

In the embodiments of the disclosure, using the fluorine-containing gas and the hydrogen gas to perform the selectivity proximity push process and the treatment process not only widens the recesses but also removes the carbon residues. Moreover, the dissociated hydrogen gas may be absorbed by the substrate, so as to prevent oxidization of the surface of the substrate or formation of a Si—F bonding that affect the structure and quality of the strained layers formed in the subsequent epitaxial process. By using the fluorine-containing gas and the hydrogen gas, $H_yF_z^*$ or $H_xF_y^*$ having a high selectivity ratio to the isolation structure (e.g., silicon oxide) and the first spacer and the second spacer (e.g., silicon nitride, SiCON, SiCN) may be generated. Thus, when the selectivity proximity push process is performed in the above embodiments, the critical dimension of the first spacer and the second spacer may be maintained, the loss of the isolation structure is reduced, so that an increase of Ceff may be prevented or suppressed.

In accordance with some embodiments of the present disclosure, a method for fabricating a fin field effect transistor (FinFET) includes steps as follows. A gate stack is formed over a substrate having a semiconductor fin. Recesses are formed in the semiconductor fin beside the gate stack. A pre-clean process is performed to remove native oxides on surfaces of the recesses. After the pre-clean process, a selectivity proximity push process is performed using a fluorine-containing gas and a first hydrogen gas to the recesses. Strained layers are formed in the recesses.

In accordance with alternative embodiments of the present disclosure, a method for fabricating a fin field effect transistor (FinFET) includes steps as follows. A gate stack is formed over a substrate having a semiconductor fin. Spacers are formed at sidewalls of the gate stack, wherein the spacers contain carbon. Recesses are formed in the semiconductor fin beside the gate stack. A pre-clean process is performed to remove native oxides on surfaces of the recesses. A treatment process is performed ex-situ to the recesses. In addition, in a selectivity proximity push process, carbon is etched faster than oxide is etched. Strained layers are formed in the recesses.

In accordance with yet alternative embodiments of the present disclosure, a method for fabricating a semiconductor device includes steps as follows. A substrate having a first semiconductor fin and a second semiconductor fin is provided in a P-type FinFET region and an N-type FinFET region respectively. A first gate stack and a second gate stack are formed on the first semiconductor fin and the second semiconductor fin respectively. A spacer material layer is formed in the P-type FinFET region and the N-type FinFET region of the substrate. A mask layer is formed to cover the spacer material layer in the N-type FinFET region and expose the spacer material layer in the P-type FinFET region. In addition, a material of at least one of the spacer material layer and the mask layer comprises a carbon containing material. The spacer material layer in the P-type FinFET region is etched to form spacers at sidewalls of the first gate stack. Recesses are formed in the first semiconductor fin beside the gate stack. The mask is removed. A selectivity proximity push process and a treatment process are performed using a fluorine-containing gas and a first hydrogen gas to widen the recesses and remove carbon residues on the recesses. Strained layers are formed in the recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a fin field effect transistor (FinFET), comprising:
    forming a gate stack over a substrate having a semiconductor fin;
    forming recesses in the semiconductor fin beside the gate stack;
    performing a pre-clean process to remove native oxides on surfaces of the recesses;
    after the pre-clean process, performing a selectivity proximity push process using a fluorine-containing gas and a first hydrogen gas to the recesses; and
    forming strained layers in the recesses.

2. The method of claim 1, wherein one of the fluorine-containing gas and the first hydrogen gas serves as a plasma source introduced to the substrate through a showerhead, and the other one of the fluorine-containing gas and the hydrogen gas serves as a co-flow gas directly introduced to the substrate.

3. The method of claim 2, wherein the selectivity proximity push process is performed by further using a second hydrogen gas, and the second hydrogen gas and the fluorine-containing gas serve as the plasma sources or the co-flow gases.

4. The method of claim 1, wherein the fluorine-containing gas and the first hydrogen gas serve as plasma sources.

5. The method of claim 1, wherein after performing the selectivity proximity push process, the method further comprises performing a post-clean process to remove native oxides on surfaces of the recesses.

6. The method of claim 1, wherein the fluorine-containing gas comprises $NF_3$.

7. A method for fabricating a fin field effect transistor (FinFET), comprising:
    forming a gate stack over a substrate having a semiconductor fin;
    forming spacers at sidewalls of the gate stack, wherein the spacers contain carbon;
    forming recesses in the semiconductor fin beside the gate stack;
    performing a pre-clean process to remove native oxides on surfaces of the recesses;
    ex-situ performing a treatment process to the recesses, wherein in a selectivity proximity push process, carbon is etched faster than oxide is etched; and
    forming strained layers in the recesses.

8. The method of claim 7, further comprising using a fluorine-containing gas and a first hydrogen gas.

9. The method of claim 8, wherein the fluorine-containing gas comprises $NF_3$.

10. The method of claim 8, wherein one of the fluorine-containing gas and the first hydrogen gas serves as a plasma source introduced to the substrate through a showerhead, and the other one of the fluorine-containing gas and the hydrogen gas serves as a co-flow gas directly introduced to the substrate.

11. The method of claim 10, wherein the treatment process is performed by further using a second hydrogen gas together with the fluorine-containing gas as the plasma sources or the co-flow gases.

12. The method of claim 8, wherein the fluorine-containing gas and the first hydrogen gas serve as plasma sources.

13. The method of claim 8, before forming the recesses, the method further comprises performing a pre-clean process to remove native oxides on surfaces of the recesses.

14. The method of claim 9, further comprising performing a post-clean process to remove native oxides on surfaces of the recesses.

15. A method for fabricating a semiconductor device, comprising:
    providing a substrate having a first semiconductor fin and a second semiconductor fin in a P-type FinFET region and an N-type FinFET region respectively
    forming a first gate stack and a second gate stack on the first semiconductor fin and the second semiconductor fin respectively;
    forming a spacer material layer in the P-type FinFET region and the N-type FinFET region of the substrate;
    forming a mask layer to cover the spacer material layer in the N-type FinFET region and expose the spacer material layer in the P-type FinFET region, wherein a material of at least one of the spacer material layer and the mask layer comprises a carbon containing material;
    etching the spacer material layer in the P-type FinFET region to form spacers at sidewalls of the first gate stack;
    forming recesses in the first semiconductor fin beside the gate stack;
    removing the mask layer;
    performing a selectivity proximity push process and a treatment process using a fluorine-containing gas and a first hydrogen gas to widen the recesses and remove carbon residues on the recesses; and
    forming strained layers in the recesses.

16. The method of claim 15, wherein one of the fluorine-containing gas and the first hydrogen gas serves as a plasma source introduced to the substrate through a showerhead, and the other one of the fluorine-containing gas and the hydrogen gas serves as a co-flow gas directly introduced to the substrate.

17. The method of claim 16, wherein the selectivity proximity push process and the treatment process further use a second hydrogen gas together with the fluorine-containing gas the plasma sources or the co-flow gases.

18. The method of claim 15, wherein the fluorine-containing gas and the first hydrogen gas serve as plasma sources.

19. The method of claim 15, wherein the fluorine-containing gas comprises $NF_3$.

20. The method of claim 15, wherein the selectivity proximity push process and the treatment process are performed at the same time.

* * * * *